United States Patent
Itahara

(10) Patent No.: US 7,385,541 B2
(45) Date of Patent: Jun. 10, 2008

(54) POWER AMPLIFYING APPARATUS, POWER COMBINING SYSTEM AND DELAY MEASURING METHOD FOR POWER COMBINING SYSTEM

(75) Inventor: Hiroshi Itahara, Kanagawa (JP)

(73) Assignee: Matsushita Electric Industrial Co., Ltd., Osaks (JP)

(*) Notice: Subject to any disclaimer, the term of this patent is extended or adjusted under 35 U.S.C. 154(b) by 0 days.

(21) Appl. No.: 10/598,562

(22) Filed: Sep. 5, 2006

(65) Prior Publication Data
US 2007/0171111 A1 Jul. 26, 2007

(30) Foreign Application Priority Data
Aug. 19, 2004 (JP) .............................. 2004-239220

(51) Int. Cl.
H03M 1/66 (2006.01)
(52) U.S. Cl. ........................................ 341/144; 375/296
(58) Field of Classification Search ................ 341/144; 375/223, 232, 296, 230, 257; 370/276
See application file for complete search history.

(56) References Cited

U.S. PATENT DOCUMENTS

| 4,535,443 A | * | 8/1985 | Korevaar | 370/276 |
| 4,573,166 A | * | 2/1986 | Frederick | 375/223 |
| 4,745,622 A | * | 5/1988 | Gupta | 375/232 |
| 4,773,082 A | * | 9/1988 | Somer et al. | 375/296 |
| 4,784,094 A | * | 11/1988 | Bordi et al. | 123/90.25 |

FOREIGN PATENT DOCUMENTS

| WO | 99/66637 | 12/1999 |
| WO | 01/06643 | 1/2001 |

* cited by examiner

*Primary Examiner*—Jean B Jeanglaude
(74) *Attorney, Agent, or Firm*—Pearne & Gordon LLP

(57) ABSTRACT

A power amplifying apparatus includes a distributing unit that divides an input digital signal to a plurality of the input digital signals so as to distribute the input digital signals to a plurality of devices respectively, and a synthesizing unit that synthesizes output signals from the devices to output the synthesized output signal. Each of the devices includes a delay regulating unit that regulates a delay amount of the input digital signal, a digital/analog converting unit that converts the digital signal regulated by the delay regulating unit to an analog signal, and an amplifying unit that amplifies the analog signal to output the amplified analog signal to the synthesizing unit.

6 Claims, 5 Drawing Sheets

POWER AMPLIFYING APPARATUS, POWER COMBINING SYSTEM AND DELAY MEASURING METHOD FOR POWER COMBINING SYSTEM

TECHNICAL FIELD

The present invention relates to a power amplifying apparatus, a power combining system and a delay regulating system for the power combining system.

BACKGROUND ART

A very high output is required for a power amplifying apparatus to be used in a mobile base station or a transmitter for broadcasting. For example, one output reaches 40 to 80 W in a base station for WCDMA and reaches several kW in equipment for digital broadcasting. In such a transmitter, one power amplifier device cannot cover a single amplifier unit. For this reason, it is necessary to connect several devices or amplifier units in parallel.

FIG. 5 is a diagram showing the schematic structure of a power amplifying apparatus using a power combining system. As shown in FIG. 5, an input signal is distributed to a plurality of systems (parallel devices) by a distributor 101, and the signals thus distributed are amplified by power amplifiers 102*a* to 102*c* in the parallel units (devices) respectively and a signal synthesized by a synthesizer 103 is output. In such a conventional power combining system, it is necessary to accurately control the group delay of each parallel unit or device. For the most basic method for carrying out the group delay, a delay line is used in each parallel unit.

However, it is very hard to manufacture and regulate a parallel power combining system using the delay line in order to match the delays of the parallel units. In the case in which the regulation is not sufficient, a synthetic output power is attenuated or a frequency characteristic is generated on an output.

If an analog signal is input, moreover, it is possible to carry out a group delay measurement for a delay between an input and an output by using a network analyzer and to theoretically obtain the length of the delay line from a measured value (delay amount).

In an amplifier using such a parallel power combining system, however, an input is digital in a system using a digital predistortion (for example, JP-A-2003-332853), an EER (Envelope Elimination and Restoration) and an LINC (Linear amplification with Non-linear Components). Therefore, it is also impossible to carry out a group delay measurement using such as the network analyzer.

DISCLOSURE OF THE INVENTION

In consideration of the conventional circumstances, it is an object of the invention to provide a power amplifying apparatus and a power combining system capable of easily regulating a delay and a delay measuring method for the power combining system.

In order to achieve the above object, according to the present invention, there is provided a power amplifying apparatus, comprising:

a distributing unit that divides an input digital signal to a plurality of the input digital signals so as to distribute the input digital signals to a plurality of devices respectively; and a synthesizing unit that synthesizing output signals from the devices to output the synthesized output signal, wherein each of the devices includes:

a delay regulating unit that regulates a delay amount of the input digital signal;

a digital/analog converting unit that converts the digital signal regulated by the delay regulating unit to an analog signal; and an amplifying unit that amplifies the analog signal to output the amplified analog signal to the synthesizing unit.

By this structure, it is possible to easily regulate a delay in the power amplifying apparatus requiring the high outputs of a digital input and an analog output.

Preferably, the delay regulating unit includes a shift register in which the number of stages is variable. The delay regulating unit adjusts the number of stages of the shift register to regulate the delay amount of the input digital signal.

Consequently, it is possible to easily regulate a delay with a simple structure.

Preferably, the power amplifying apparatus further includes an input clock control unit that controls a phase of an input clock signal of the digital/analog converting unit of each of the devices.

By this structure, it is possible to control a delay with a high resolution by controlling the phase of an input clock signal when the sampling frequency of the input clock of the digital/analog converting unit is low.

Preferably, the delay regulating unit includes a digital filter. The delay regulating unit adjusts a filter coefficient of the digital filter to regulate the delay amount of the input digital signal.

Consequently, it is possible to easily regulate a delay with a simple structure when the sampling rate of the digital/analog converting unit is low.

According to the present invention, there is also provided a power combining system, comprising:

a distributing unit that divides an input digital signal to a plurality of the input digital signals so as to distribute the input digital signals to a plurality of devices respectively; and a synthesizing unit that synthesizing output signals from the devices to output the synthesized output signal;

wherein each of the devices includes:

a delay regulating unit that regulates a delay amount of the input digital signal;

a digital/analog converting unit that converts the digital signal regulated by the delay regulating unit to an analog signal; and an amplifying unit that amplifies the analog signal to output the amplified analog signal to the synthesizing unit, the power combining system, further comprising:

a measuring unit that acquires at least one of an output power and a frequency characteristic of the synthesized output signal to measure a delay between the devices; and a control unit that controls the delay regulating unit so as to regulate the delay amount of the input digital signal based on the measured delay between the devices.

According to the present invention, there is also provided a delay measuring method for a power combining system including a plurality of devices, digital input signals being distributed to the devices, and analog output signals from the devices being synthesized to a synthesized output signal, the delay measuring method comprising:

acquiring at least one of an output power and a frequency characteristic of the synthesized output signal; and measuring a delay between the devices based on the at least one of the output power and the frequency characteristic of the synthesized output signal.

By this method, it is possible to measure a delay amount in the power combining system for the digital input and the analog output.

According to the invention, it is possible to provide a power amplifying apparatus and a power combining system capable of easily regulating a delay and a delay measuring method for a power combining system.

BRIEF DESCRIPTION OF THE DRAWINGS

The above objects and advantages of the present invention will become more apparent by describing in detail preferred exemplary embodiments thereof with reference to the accompanying drawings, wherein.

BEST MODE FOR CARRYING OUT THE INVENTION

First Embodiment

Figure 1:
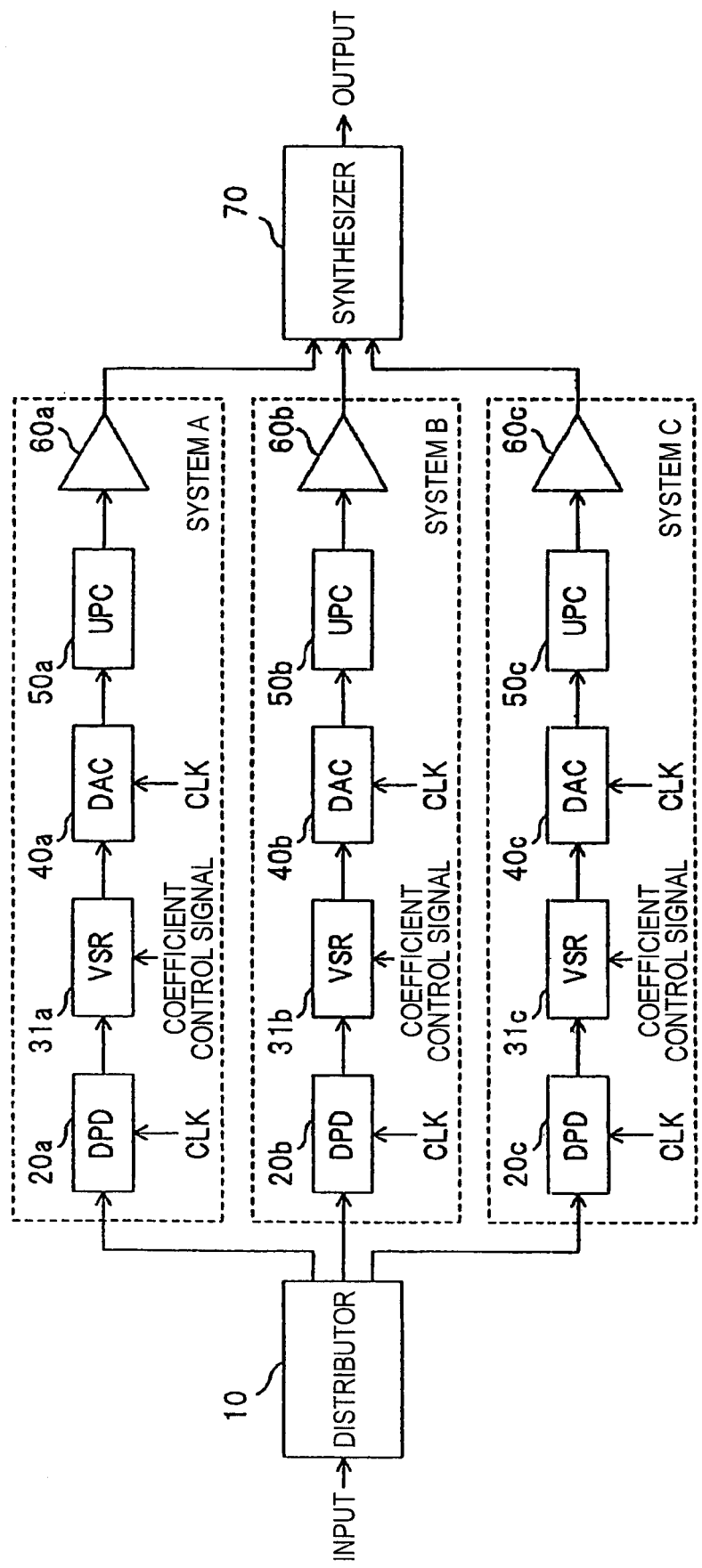
FIG. 1 is a diagram showing the schematic structure of a digital distortion compensation amplifying apparatus according to a first embodiment of the invention.

FIG. 1 is a diagram showing the schematic structure of a digital distortion compensation amplifying apparatus according to a first embodiment of the invention. As shown in FIG. 1, the digital distortion compensation amplifying apparatus according to the first embodiment comprises a distributor 10, digital predistortion portions (hereinafter referred to as DPDs) 20a, 20b and 20c, variable shift registers (hereinafter referred to as VSRs) 31a, 31b and 31c, digital/analog converters (hereinafter referred to as DACs) 40a, 40b and 40c, up converters (hereinafter referred to as UPCS) 50a, 50b and 50c, power amplifiers 60a, 60b and 60c, and a synthesizer 70.

Next, description will be given to the operation of the digital distortion compensation amplifying apparatus according to the first embodiment. The distributor 10 is an example of a distributing unit and serves to distribute a digital signal input to the digital distortion compensation amplifying apparatus to a plurality of systems (devices). In the embodiment according to the invention, description will be given by taking, as an example, the case in which an input signal is distributed to three systems in total, that is, a system A, a system B and a system C so as to be amplified.

The DPDs 20a, 20b and 20c provided in the systems (the systems A, B and C) respectively carry out a predistortion processing of adding the reverse characteristics of the distortions of the distortion compensation power amplifiers 60a, 60b and 60c to baseband digital signals distributed by the distributor 10, for example. The predistortion processing is carried out by giving a clock signal (CLK) having a predetermined sampling frequency.

The VSRs 31a, 31b and 31c are an example of a delay regulating unit and serve to give predetermined delay amounts to the signals subjected to the predistortion processing by the DPDs 20a, 20b and 20c and to output the same signals, respectively.

The DACs 40a, 40b and 40c are an example of a digital/analog converting unit and serve to convert the signals output from the VSRs 31a, 31b and 31c from digital signals to analog signals by setting a predetermined sampling frequency as an input clock, respectively. The UPCs 50a, 50b and 50c convert the analog signals output from the DACs 40a, 40b and 40c from a baseband to a radio frequency (RF) band respectively, for example.

The power amplifiers 60a, 60b and 60c are an example of an amplifying unit and serve to amplify the signals output from the UPCs 50a, 50b and 50c, respectively. The synthesizer 70 is an example of a synthesizing unit and serves to synthesize and output signals sent from the power amplifiers 60a, 60b and 60c, that is, signals sent from the systems A, B and C.

In the digital distortion power amplifying apparatus according to the first embodiment, the VSRs 31a, 31b and 31c are inserted as variable-length buffers before the DACs as described above. By adjusting the number of stages of the VSRs 31a, 31b and 31c, it is possible to regulate the delay amount of each of the systems.

A delay control amount $C_1$ (from the output end of the DPD to the input end of the DAC) is expressed in Equation (1), wherein the sampling frequency of the DAC is represented by $f_s$ and the number of stages of the VSR is represented by n.

$$C_1 = 1/f_s \cdot n \quad (1)$$

In the case in which the delay regulation is carried out for a signal in a microwave band, the delay control amount is in ns (nanosecond) order. Therefore, the sampling frequencies of the DACs 40a, 40b and 40c require approximately 1 GHz.

According to the first embodiment of the invention, it is possible to easily regulate a delay with a simple structure in the power amplifying apparatus for the digital input/analog output of a power combining system.

While the description has been given to the case in which the digital baseband predistortion is used in each system in the embodiment, a power amplifying apparatus for a digital input/analog output, for example, a power amplifying apparatus using an EER and an LINC can produce an advantage that a delay can easily be regulated.

Second Embodiment

Figure 2:
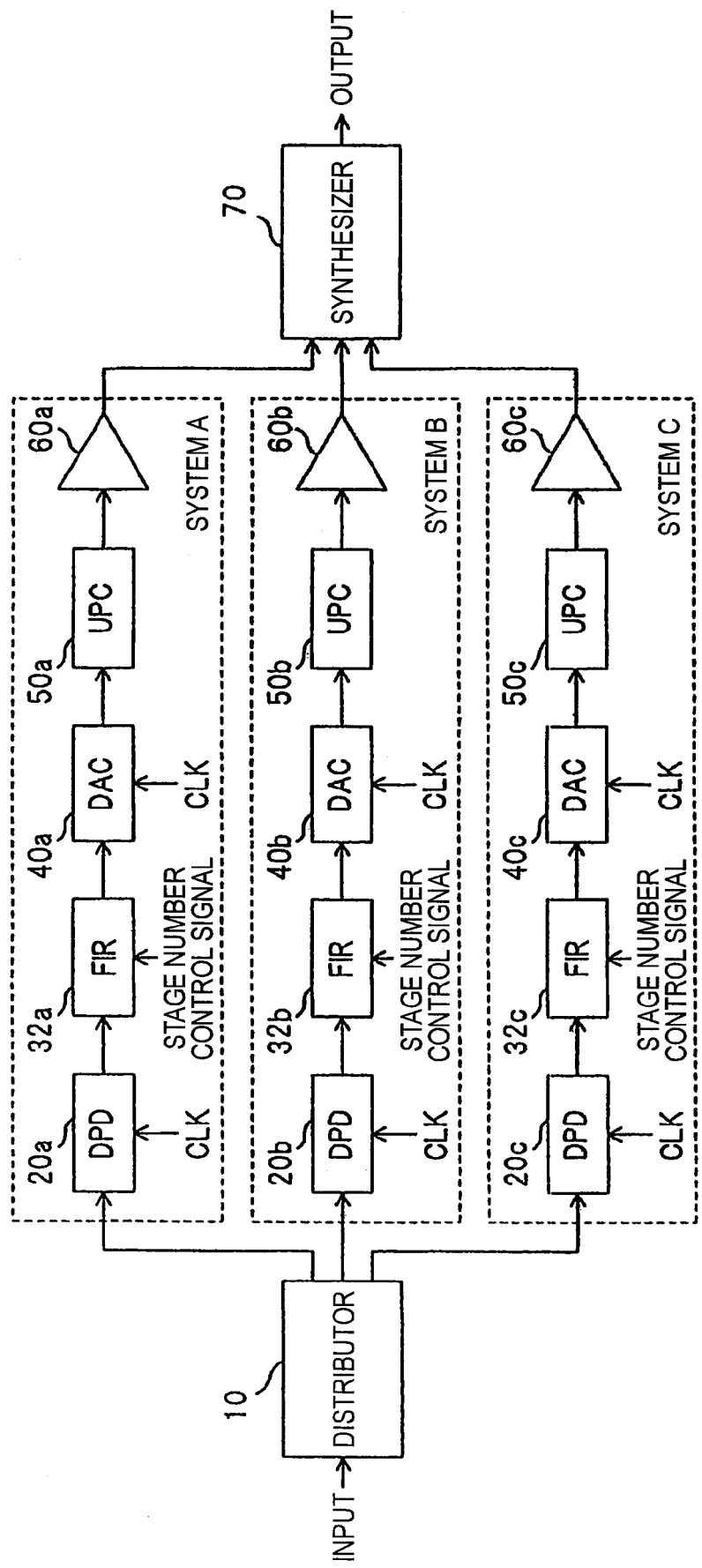
FIG. 2 is a diagram showing the schematic structure of a digital distortion compensation amplifying apparatus according to a second embodiment of the invention.

FIG. 2 is a diagram showing the schematic structure of a digital distortion compensation amplifying apparatus according to a second embodiment of the invention. In FIG. 2, overlapping portions with those in FIG. 1 described in the first embodiment have the same reference numerals.

As shown in FIG. 2, in the digital distortion compensation amplifying apparatus according to the second embodiment, FIR (Finite Impulse Response) filters 32a, 32b and 32c are provided in the former stages of DACs 40a, 40b and 40c as an example of a delay regulating unit.

By providing the FIR filters 32a, 32b and 32c for a delay regulation, it is possible to carry out the delay regulation also in the case in which the DACs 40a, 40b and 40c having lower sampling frequencies are used. In this case, a coefficient control is carried out to perform an oversampling design over the FIR filters 32a, 32b and 32c in order to obtain a necessary delay regulating resolution.

The FIR filters 32a, 32b and 32c control the coefficients so that a delay amount can be regulated. For the FIR filters, a processing time is generated depending on the number of filter stages.

A control delay amount $C_2$ (from the output end of a DPD to the input end of the DAC) is expressed in Equation (2), wherein the number of filter stages of the FIR filter is represented by m, a delay amount based on a coefficient control is represented by $D_f$, and the sampling frequency of the DAC is represented by $f_s$.

$$C_2 = (m + D_f) \cdot 1/f_s \qquad (2)$$

By carrying out a design to oversample the sampling rate of the FIR filter, accordingly, a desirable delay regulation can be implemented even if the DAC having a low sampling rate is used.

According to the second embodiment of the invention, it is possible to easily carry out a delay regulation with a simple structure also in the case in which the sampling frequency of an analog conversion is low in the power amplifying apparatus for the digital input/analog output of a power combining system.

Third Embodiment

Figure 3:
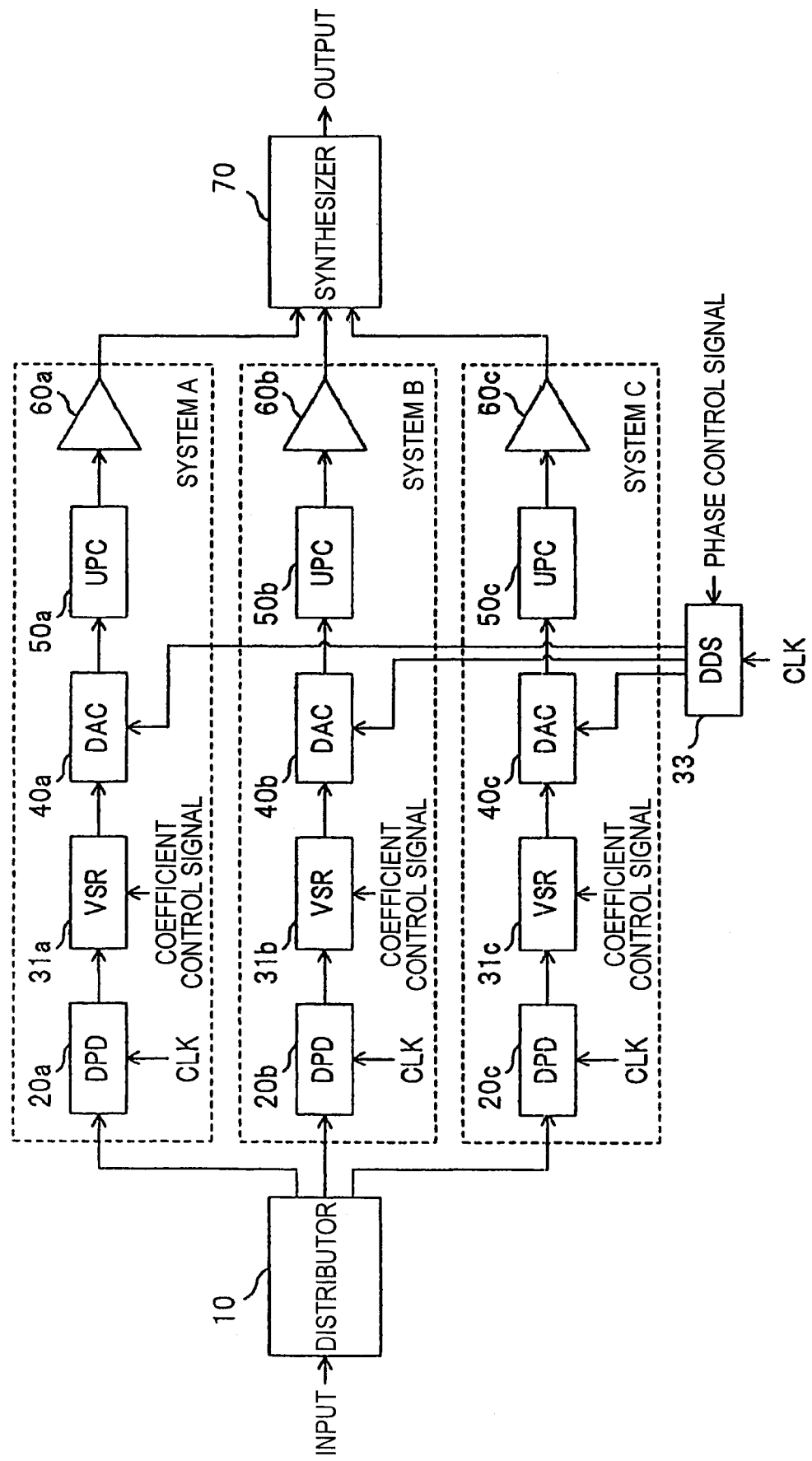
FIG. 3 is a diagram showing the schematic structure of a digital distortion compensation amplifying apparatus according to a third embodiment of the invention.

FIG. 3 is a diagram showing the schematic structure of a digital distortion compensation amplifying apparatus according to a third embodiment of the invention. In FIG. 3, overlapping portions with those in FIG. 1 described in the first embodiment have the same reference numerals.

As shown in FIG. 3, the digital distortion compensation amplifying apparatus according to the third embodiment is provided with a DDS (Direct Digital Synthesizer) 33 for controlling an input clock signal CLK of DACs 40a, 40b and 40c.

The DDS 33 is an example of an input clock control unit and is a circuit capable of converting an input frequency to an optional frequency within a range of at most ½ on the basis of a frequency which is several times as great as the frequencies of the input clock signals (CLK) of the DACs 40a, 40b and 40c.

In the digital distortion compensation amplifying apparatus according to the embodiment, the DDS 33 is used as a circuit for changing an initial phase with respect to a sampling frequency without varying the frequency of the input clock signal (a sampling frequency). Consequently, a phase control can be carried out for one wavelength in a resolution of approximately one-thousandth. Therefore, it is possible to control a delay in the width of the number of stages of a VSR with a resolution of one-thousandth of a sampling rate by using VSRs 31a, 31b and 31c together.

A delay control amount $C_3$ (from the output end of a DPD to the input end of an amplifier) is expressed in Equation (3), wherein the sampling frequency of the DAC is represented by $f_s$, the number of stages of the VSR is represented by n, and the phase control amount of the DDS is represented by C.

$$C_3 = 1/f_s \cdot (n + C) \qquad (3)$$

Accordingly, such a rough regulation as to correspond to the sampling frequency is carried out by the control of the number of stages of the VSR, and furthermore, a fine regulation is performed by the execution of a delay regulation through the phase control of the DDS. Also in the case in which the DAC having a low sampling frequency is used, therefore, a sufficient delay regulation can be carried out. Moreover, the delay is not regulated by a filter. Consequently, it is possible to control a delay amount without reducing the band of an input signal.

According to the third embodiment of the invention, it is possible to easily carry out the delay regulation with a simple structure also in the case in which the sampling frequency of an analog conversion is low in a power amplifying apparatus for the digital input/analog output of a power combining system.

Fourth Embodiment

Figure 4:
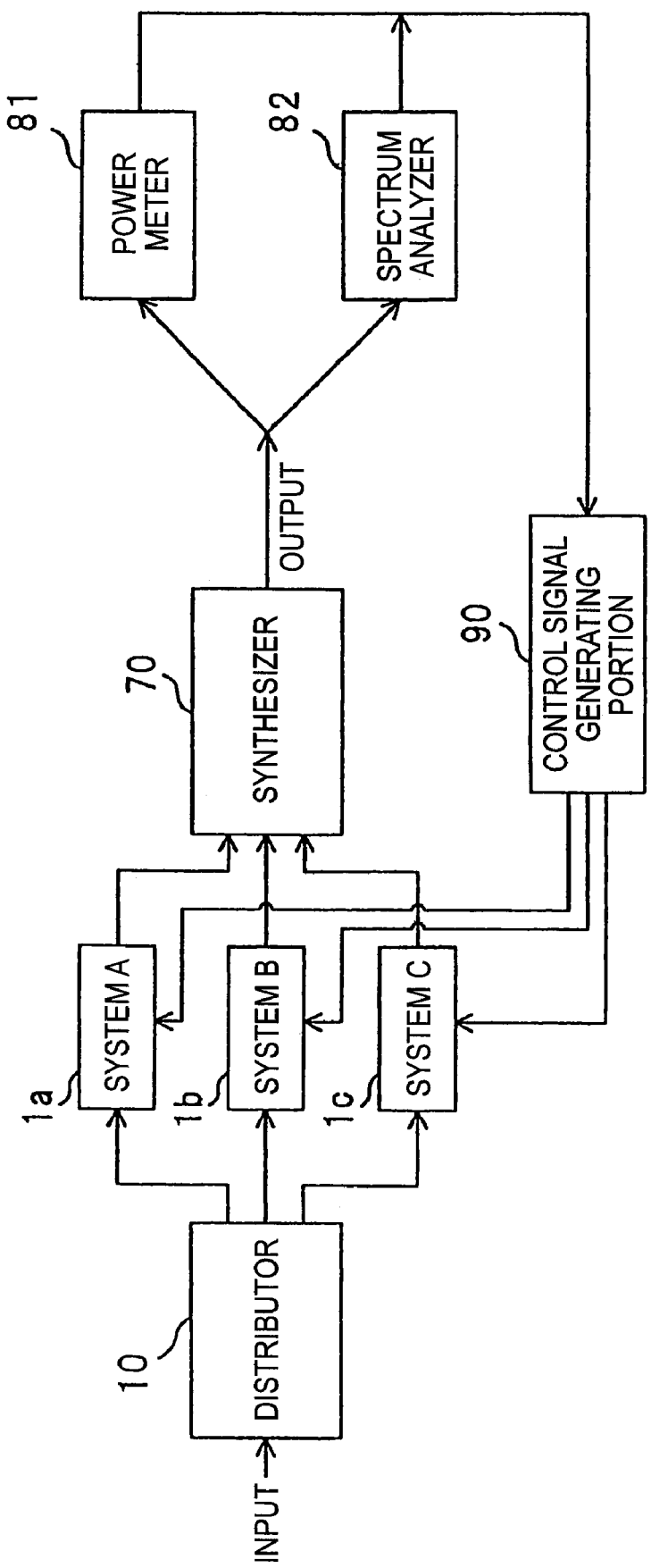
FIG. 4 is a diagram showing the schematic structure of a delay measuring system according to a fourth embodiment of the invention.
Figure 5:
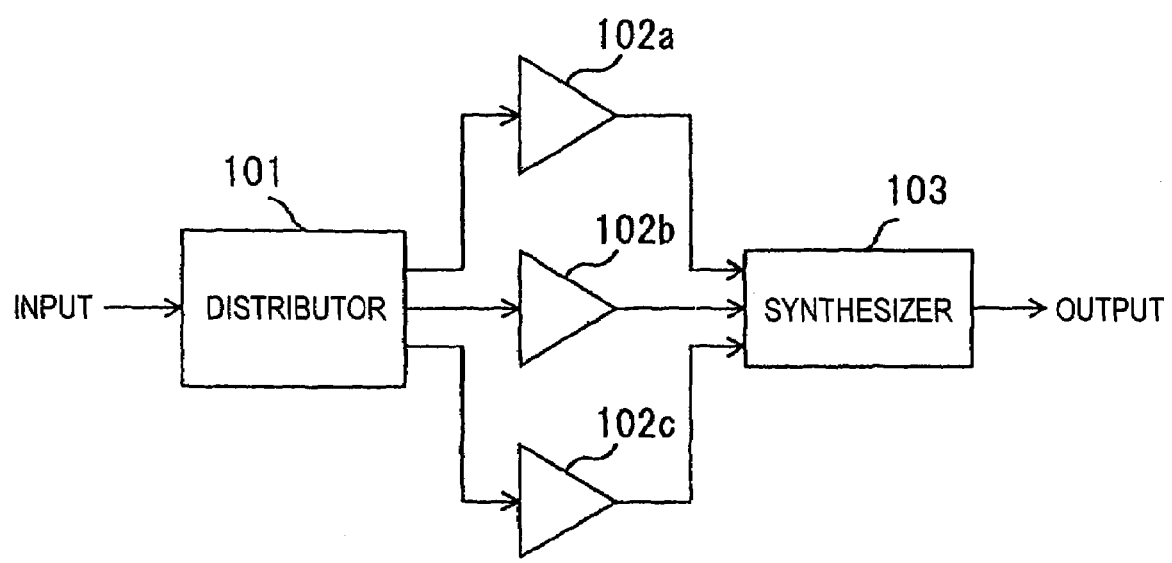
FIG. 5 is a diagram showing the schematic structure of a power amplifying apparatus using a power combining system.

FIG. 4 is a diagram showing the schematic structure of a delay measuring system according to a fourth embodiment of the invention. In FIG. 4, overlapping portions with those in FIGS. 1 to 3 described in the first to third embodiments have the same reference numerals.

As shown in FIG. 4, a power combining system has a distributor 10, a plurality of systems 1a to 1c, and a synthesizer 70. The distributor 10 serves to distribute an input digital signal to a plurality of systems (three systems A to C in the embodiment). The systems A (1a), B (1b) and C (1c) have a digital/analog converting function and output digital signals, respectively. The synthesizer 70 synthesizes and outputs the signals sent from the systems A to C (1a to 1c). More specifically, in the power combining system according to the embodiment, a digital signal is input and an analog signal is output.

The output signal of the power combining system is measured by a power meter 81 and a spectrum analyzer 82, thereby measuring the matching states of the delays of the systems A to C (1a to 1c).

The power meter 81 measures the output power level of the synthesizer 70. In the case in which the delays of the systems A to C cannot be matched well, the output power level is more lowered than that in the case in which the delays are matched. By acquiring the same output level, accordingly, it is possible to measure the matching states of the delays between the systems.

The spectrum analyzer 82 measures the frequency characteristic of a signal output from the synthesizer 70. In the case in which the delays of the systems A to C cannot be matched well, a flatness is varied over the frequency characteristic of the output signal in the vicinity of a carrier frequency. By acquiring the frequency characteristic of the output signal, accordingly, it is possible to measure the matching states of the delays between the systems.

Also in the power combining system for the digital input/analog output, consequently, it is possible to properly measure a delay.

In the case in which the systems A to C have a delay regulating function, there is provided a control signal generating portion 90 for generating a control signal for the delay regulating function based on the results of the measurement of the power meter 81 and the spectrum analyzer 82 as shown in FIG. 4. Consequently, it is possible to easily regulate a delay.

The control signal generating portion 90 generates a control signal to regulate the delay amount of each system in such a manner that an output level to be measured is maximized for the result of the output of the power meter 81. Moreover, a control signal to cause a frequency characteristic to be measured to be flatter is generated for the result of the output of the spectrum analyzer 82.

Examples of the regulating method include a method for fixing any of the systems and sequentially regulating the delays of the other systems, thereby regulating the delay.

The control signal generated by the control signal generating portion 90 is a coefficient control signal to be input to the VSRs 31a to 31c if the circuits of the systems A to C (1a to 1c) are the systems A to C according to the first embodiment, is a stage number control signal to be input to the FIRs 32a to 32c if the same circuits are the systems A to C according to the second embodiment, and is a coefficient control signal to be input to the VSRs 31a to 31c and a phase control signal to be input to the DDS 33 if the same circuits are the systems A to C according to the third embodiment, for example.

Referring to the results of the measurement of the power meter 81 and the spectrum analyzer 82, a high correlation can be observed for the delay matching states between the systems. Accordingly, it is possible to measure the delay by only one of the power meter 81 and the spectrum analyzer 82. By carrying out the measurement through both of them, it is possible to measure the delay more reliably.

According to the fourth embodiment of the invention, it is possible to measure a delay in the power combining system, and furthermore, to easily regulate the delay amount of each system based on the measured delay.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2004-239220 filed on Aug. 19, 2004, the contents of which are incorporated herein for reference.

INDUSTRIAL APPLICABILITY

The power amplifying apparatus and the delay measuring method for a power combining system according to the invention have an advantage that a delay can easily be regulated, and are useful for a mobile base station or a transmitter for broadcasting.

The invention claimed is:

1. A power amplifying apparatus, comprising:
   a distributing unit that obtains an input digital signal and outputs the input digital signal to a plurality of devices respectively; and
   a synthesizing unit that synthesizing output signals from the devices to output the synthesized output signal, wherein each of the devices includes:
      a delay regulating unit that regulates a delay amount of the input digital signal;
      a digital/analog converting unit that converts the digital signal regulated by the delay regulating unit to an analog signal; and
      an amplifying unit that amplifies the analog signal to output the amplified analog signal to the synthesizing unit.

2. The power amplifying apparatus as set forth in claim 1, wherein the delay regulating unit includes a shift register in which the number of stages is variable; and
   wherein the delay regulating unit adjusts the number of stages of the shift register to regulate the delay amount of the input digital signal.

3. The power amplifying apparatus as set forth in claim 2, further comprising an input clock control unit that controls a phase of an input clock signal of the digital/analog converting unit of each of the devices.

4. The power amplifying apparatus as set forth in claim 1, wherein the delay regulating unit includes a digital filter; and
   wherein the delay regulating unit adjusts a filter coefficient of the digital filter to regulate the delay amount of the input digital signal.

5. A power combining system, comprising:
   a distributing unit that obtains an input digital signal and outputs the input digital signal to a plurality of devices respectively; and
   a synthesizing unit that synthesizing output signals from the devices to output the synthesized output signal;
   wherein each of the devices includes:
      a delay regulating unit that regulates a delay amount of the input digital signal;
      a digital/analog converting unit that converts the digital signal regulated by the delay regulating unit to an analog signal; and
      an amplifying unit that amplifies the analog signal to output the amplified analog signal to the synthesizing unit,
   the power combining system, further comprising:
   a measuring unit that acquires at least one of an output power and a frequency characteristic of the synthesized output signal to measure a delay between the devices; and
   a control unit that controls the delay regulating unit so as to regulate the delay amount of the input digital signal based on the measured delay between the devices.

6. A delay measuring method for a power combining system including a plurality of devices, digital input signals each being equal and being distributed to the devices, and analog output signals from the devices being synthesized to a synthesized output signal, the delay measuring method comprising:
   acquiring at least one of an output power and a frequency characteristic of the synthesized output signal; and
   measuring a delay between the devices based on the at least one of the output power and the frequency characteristic of the synthesized output signal.

* * * * *

UNITED STATES PATENT AND TRADEMARK OFFICE
CERTIFICATE OF CORRECTION

| | | |
|---|---|---|
| PATENT NO. | : 7,385,541 B2 | Page 1 of 1 |
| APPLICATION NO. | : 10/598562 | |
| DATED | : June 10, 2008 | |
| INVENTOR(S) | : Hiroshi Itahara | |

It is certified that error appears in the above-identified patent and that said Letters Patent is hereby corrected as shown below:

On the Title page, Items (22) and (86)

Please include the following information on the front page of patent:

(22) PCT Filed:    Aug. 3, 2005

(86) PCT No.:    PCT/JP05/14605

Signed and Sealed this

Twenty-sixth Day of August, 2008

JON W. DUDAS
*Director of the United States Patent and Trademark Office*